United States Patent
Mei et al.

(10) Patent No.: US 7,056,834 B2
(45) Date of Patent: Jun. 6, 2006

(54) FORMING A PLURALITY OF THIN-FILM DEVICES USING IMPRINT LITHOGRAPHY

(75) Inventors: Ping Mei, Palo Alto, CA (US); Warren B. Jackson, San Francisco, CA (US); Carl Philp Taussig, Redwood City, CA (US); Albert Jeans, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 86 days.

(21) Appl. No.: 10/777,005

(22) Filed: Feb. 10, 2004

(65) Prior Publication Data

US 2005/0176182 A1    Aug. 11, 2005

(51) Int. Cl.
  *H01L 21/31* (2006.01)
(52) U.S. Cl. ...................................... 438/758
(58) Field of Classification Search ............... 438/758, 438/778, 780, 782
  See application file for complete search history.

(56) References Cited

U.S. PATENT DOCUMENTS

2002/0132482 A1*  9/2002  Chou ........................ 438/692

* cited by examiner

*Primary Examiner*—Scott B. Geyer

(57) ABSTRACT

An aspect of the present invention is a method for forming a plurality of thin-film devices. The method includes providing a flexible substrate and utilizing a self-aligned imprint lithography (SAIL) process to form the plurality of thin-film devices on the flexible substrate.

30 Claims, 13 Drawing Sheets

FORMING A PLURALITY OF THIN-FILM DEVICES USING IMPRINT LITHOGRAPHY

FIELD OF THE INVENTION

The present invention relates generally to the field of semiconductor devices and more particularly to a method and system for forming a plurality of thin-film devices.

BACKGROUND OF THE INVENTION

As communication networks are extensively developed, remote communication, such as teleconference, remote education, and remote monitoring become more pervasive to work and home life. This leads to an increased demand for low-cost large area displays to provide an enhanced visual experience.

Additionally, there is also a growing demand for low cost, lightweight large-area displays for home entertainment. The current large-area plasma or LCD type displays are very heavy and expensive. For example, Toshiba's 42" plasma display weighs more than 100 lbs. and costs about $6000, while Sharp's 37" LCD display weighs 60 lbs. with a similar price.

Several companies such as eInk, ePaper and SiPix Imaging, are attempting to address this concern by developing display mediums on a plastic web. However, the formation of active pixel matrices on plastic webs is problematic. Various research groups are implementing ink-jet processing to fabricate organic transistors on a flexible substrate however, throughput and resolution present significant obstacles.

Accordingly, what is needed is a method and system for forming a plurality of thin-film devices that addresses the above-referenced problems related to throughput and resolution. The method and system should be simple, inexpensive and capable of being easily adapted to existing technology. The present invention addresses these needs.

SUMMARY OF THE INVENTION

An aspect of the present invention is a method for forming a plurality of thin-film devices. The method includes providing a flexible substrate and utilizing a self-aligned imprint lithography (SAIL) process to form the plurality of thin-film devices on the flexible substrate.

Other aspects and advantages of the present invention will become apparent from the following detailed description, taken in conjunction with the accompanying drawings, illustrating by way of example the principles of the invention.

DETAILED DESCRIPTION

The present invention relates to a method and system for forming a plurality of thin-film devices. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

A method and system for forming a plurality of thin-film devices is disclosed. Varying embodiments of the method and system allow a self-aligned imprint lithography (SAIL) process to be utilized to form a plurality of thin-film devices on a flexible substrate. Consequently, a roll-to-roll manufacturing process can be employed in conjunction with the SAIL process to provide a low cost manufacturing solution for large area and/or flexible displays.

Figure 1:
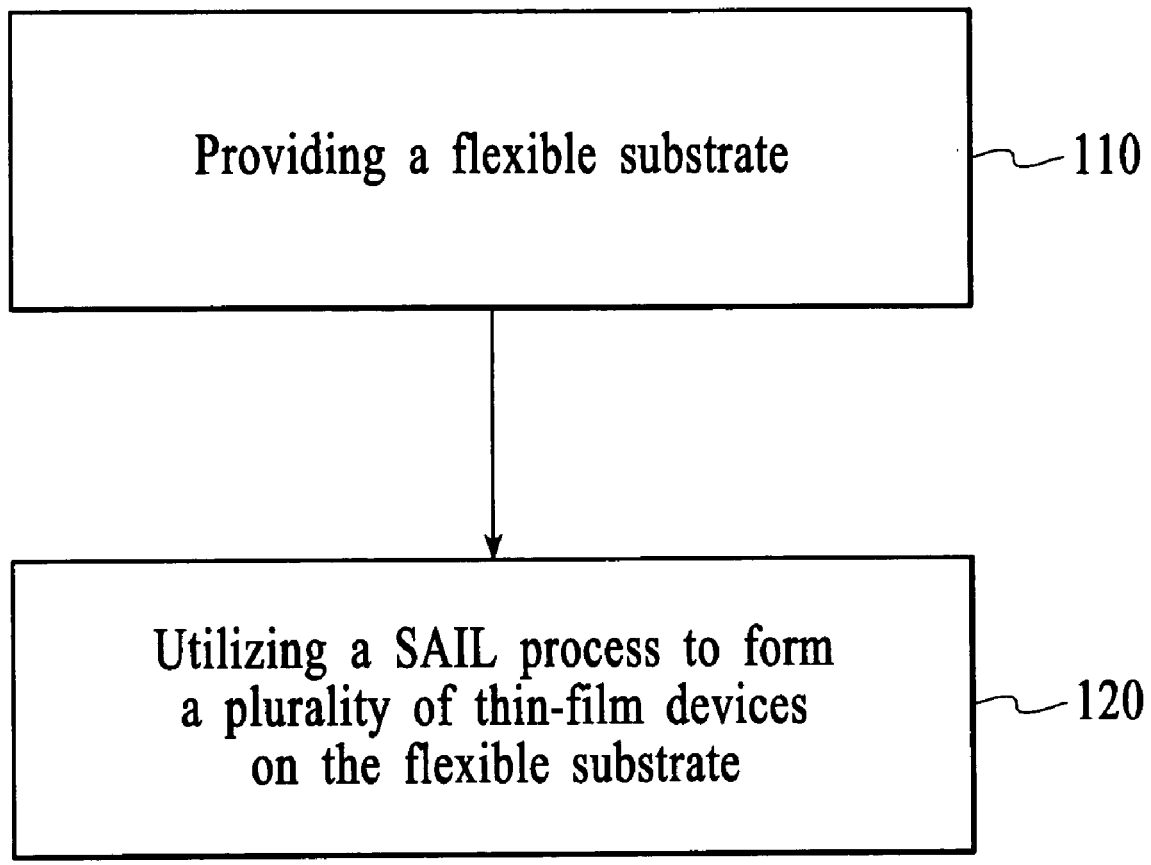
FIG. 1 is a high-level flow chart of a method in accordance with an embodiment of the present invention.

FIG. 1 is a high level flow chart of a method of forming a plurality of thin-film devices. A first step 110 includes providing a flexible substrate. In an embodiment, the flexible substrate is a substrate adequate for use in a roll-to-roll process. A final step 120 includes utilizing a SAIL process to form a plurality of thin-film devices on the flexible substrate. In one embodiment, the plurality of thin-film devices is an array of interconnected transistors.

Self-aligned imprint lithography is a process utilized to pattern thin films on a substrate material with high resolution using contact between a master with the features of the structure to be fabricated and the substrate material to be patterned. The thin films patterned can be dielectrics, semiconductors, metals or organic and can be patterned as thin film stacks or individual layers. Imprint lithography is particularly useful in roll-to-roll processing since it has a higher throughput, can handle wider substrates and tolerates a non-planar substrate.

Although the above-described concept is disclosed in the context of being utilized in conjunction with a flexible substrate, it should be noted that the process could also be implemented in conjunction with a non-flexible substrate while remaining within the spirit and scope of the present invention.

Figure 2:
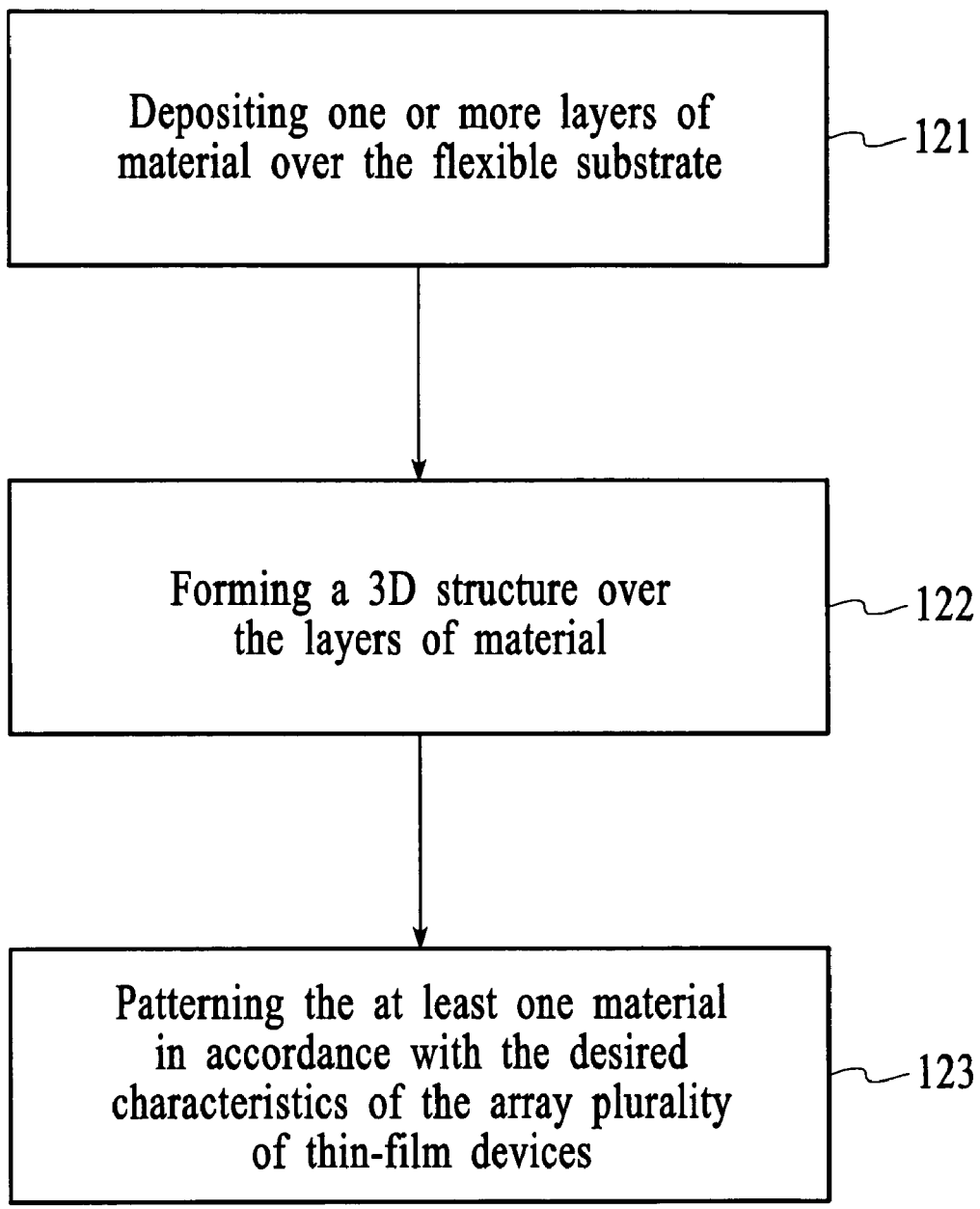
FIG. 2 is a more detailed flowchart of step 120 of the flowchart of FIG. 1 in accordance with an embodiment of the present invention.

FIG. 2 is a more detailed flowchart of step 120 of the flowchart of FIG. 1. A first step 121 includes depositing one or more layers of material over the flexible substrate. In one embodiment, the layers of material include a buffer layer, a silicon layer, a dielectric layer and a gate metal layer. A second step 122 includes forming a 3-dimensional (3D) structure over the layers of material. In one embodiment, the 3D structure is an imprint polymer and is generated by utilizing a stamping tool. A method for utilizing a stamping tool to generate a 3D pattern in a layer of material is described in a patent application Ser. No. 10/184,587 entitled "A Method and System for Forming a Semiconductor Device" which is herein incorporated by reference. A final step 123 includes patterning the at least one material in accordance with the desired characteristics of the plurality of thin-film devices.

In one embodiment, the plurality of thin-film devices are transistors that form an active matrix backplane. An active-matrix backplane of a large-area electronics is an array of pixels and conductive lines for electronic control signals and data. Each pixel has at least one transistor connected to a pixel electrode. Therefore, each pixel can be addressed independently wherein a desired voltage or current can be provided to the pixel electrode. Accordingly, this type of active matrix backplane is capable of being used for various large-area electronic applications, such as large-area displays and large-area imagers.

Figure 3:
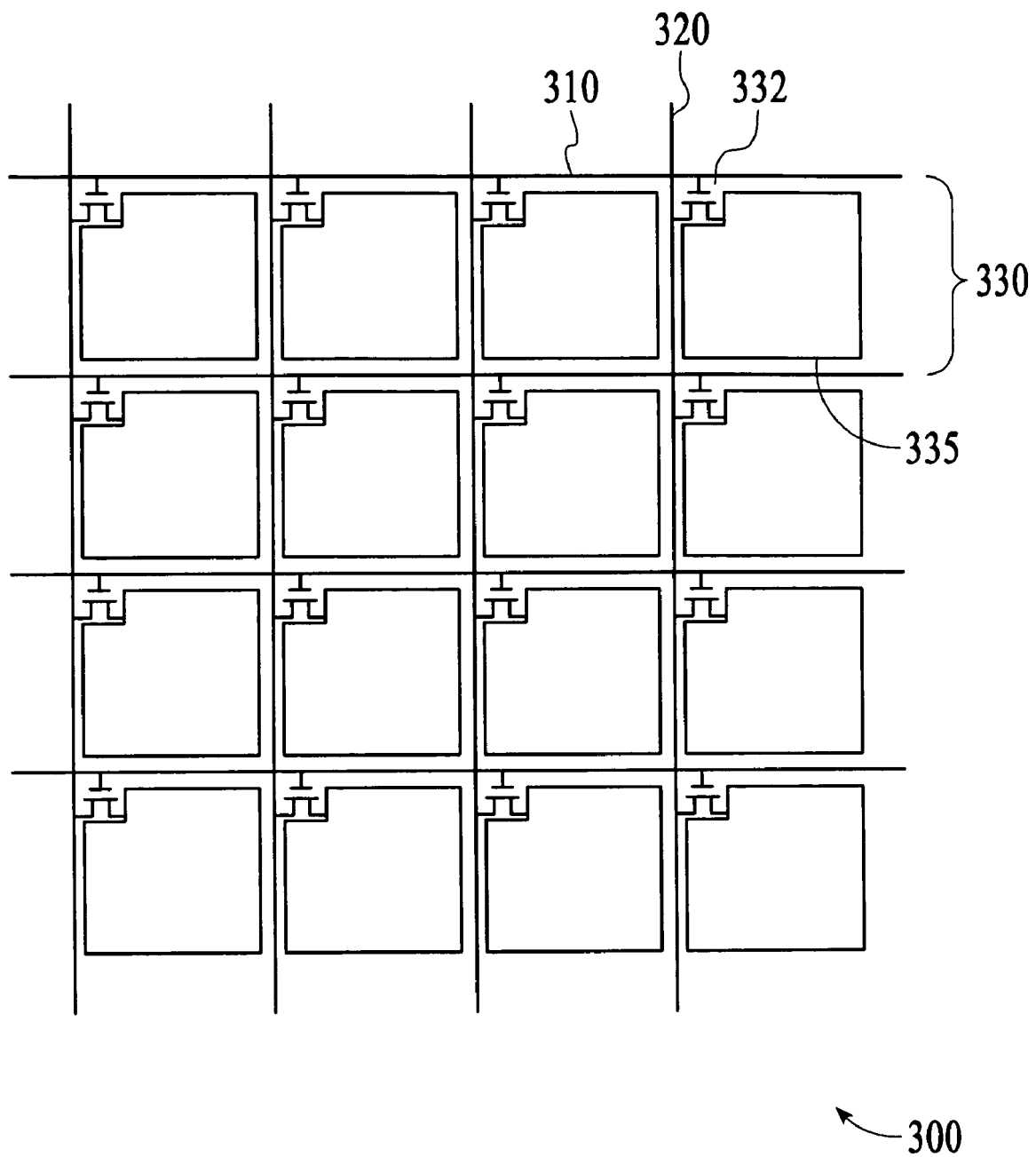
FIG. 3 shows a plurality of thin-film devices in accordance with an embodiment of the present invention.

FIG. 3 shows an active matrix backplane 300 in accordance with one embodiment. As can be seen in FIG. 3, the active matrix backplane 300 includes a plurality of pixels wherein each pixel 330 includes a thin-film transistor 332 and a pixel electrode 335. The thin-film transistor 332 is coupled to a gate line 310 and a data line 320. Since the pixel size can be large for a low-resolution display, connection of the gate line 310 and the data line 320 to external electronic drivers is inexpensive. Accordingly, all the driver devices can be externally provided.

Figure 4:
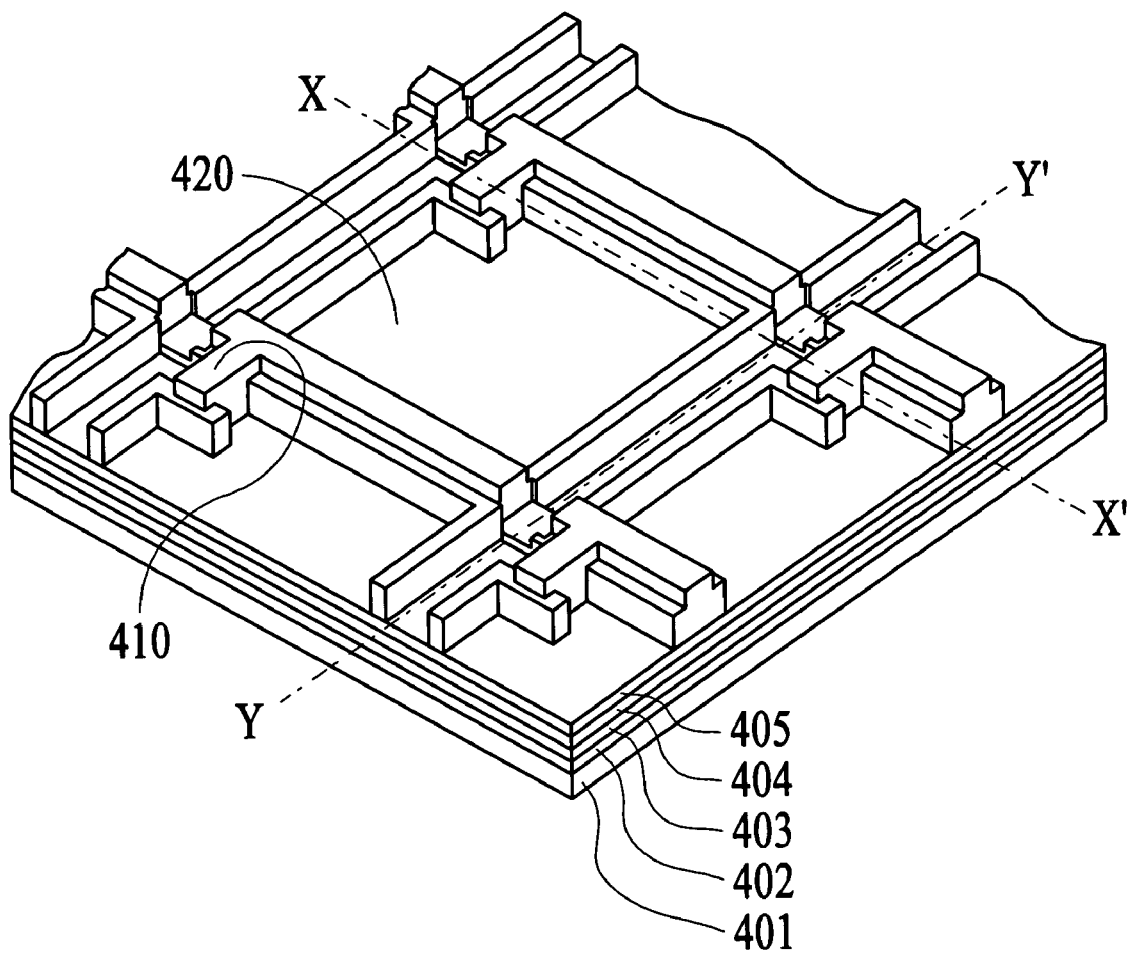
FIG. 4 shows a more detailed illustration of a structure that has been fabricated in accordance with an embodiment of the present invention.

FIG. 4 shows an illustration of a structure 400 that is in an early stage of a fabrication process in accordance with an embodiment. As can be seen in FIG. 4, the structure 400 includes a transistor 410 and a pixel electrode 420. Also shown are material layers 401–405. These layers include a flexible substrate layer 401, a buffer layer 402, a silicon layer 403, a dielectric layer 404 and a metal layer 405.

In one embodiment, the flexible substrate 401 is a polymide plastic sheet with or without an inorganic coating. The buffer layer 402 (organic or inorganic coating) can be oxynitride, silicon nitride, amorphous layer of Si:H, or BCB (Benzocyclobutene). Layer 403 is a semiconductor such as amorphous Si:H. The dielectric layer 404 is a material such as SiN. The metal layer 405 is a gate metal such as TiW, TiW/Al, MoCr, or the like.

Figure 5:
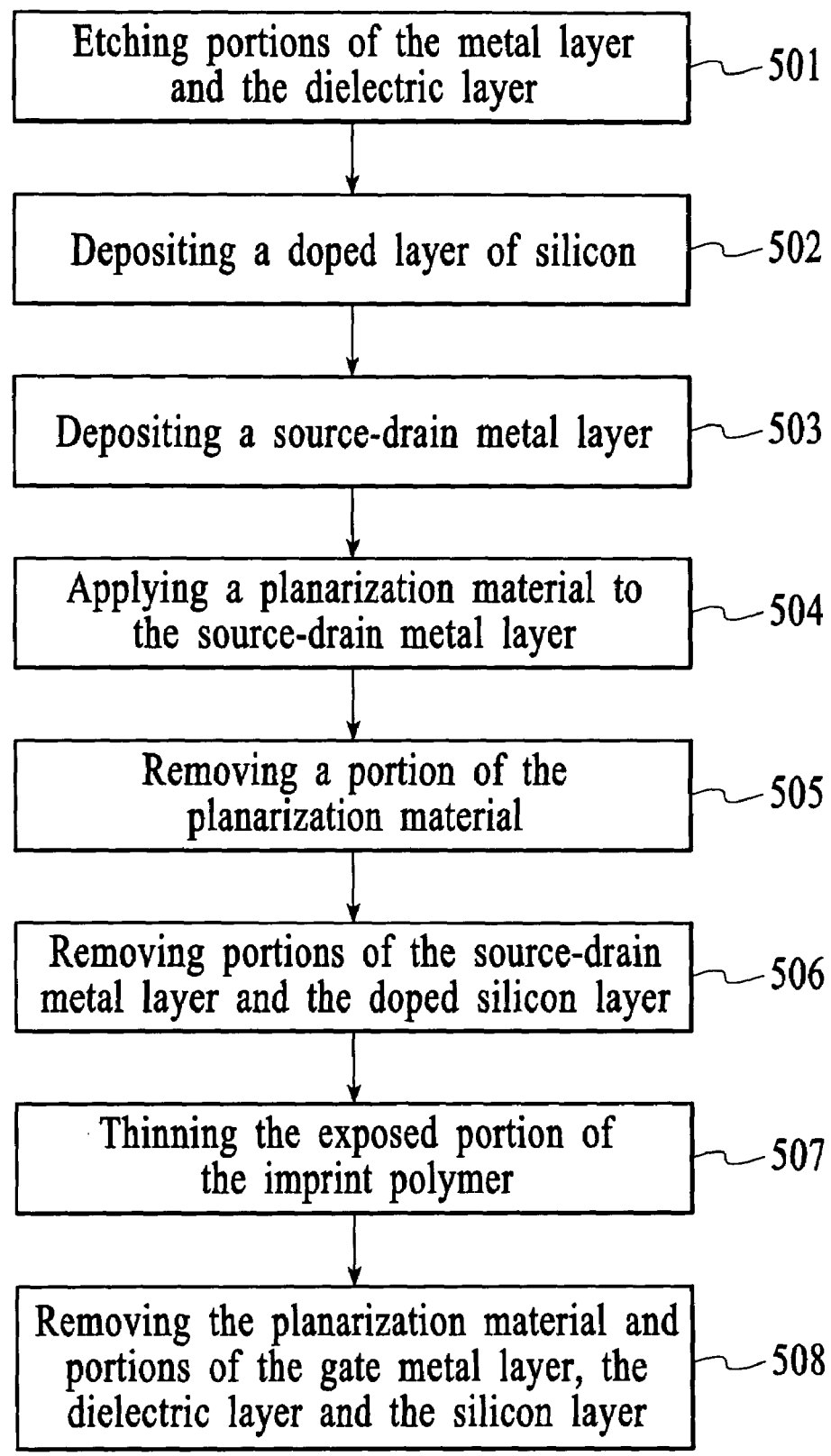
FIG. 5 shows a process for forming a plurality of thin-film devices in accordance with an embodiment of the present invention.
Figure 6:
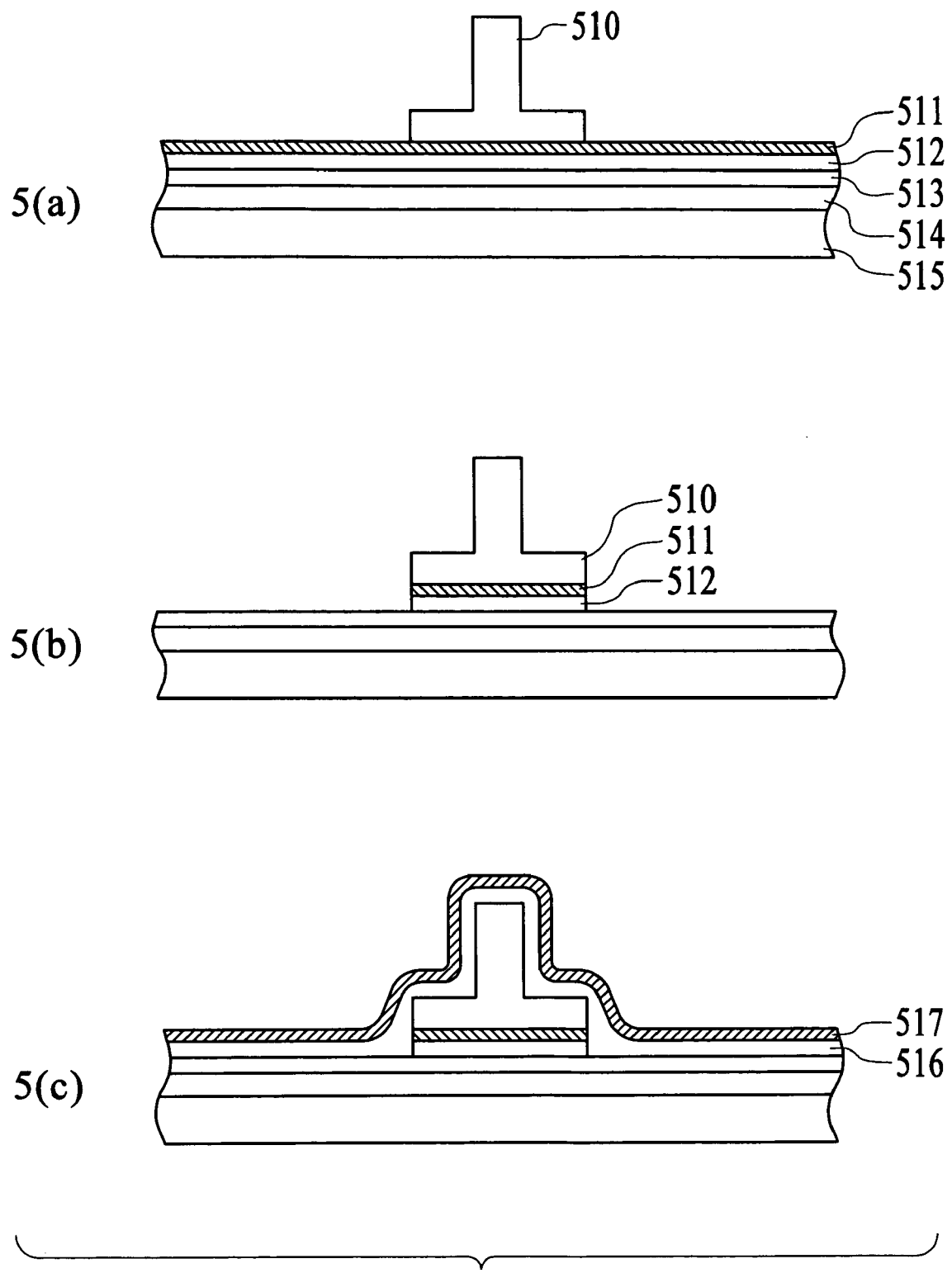
FIG. 6 shows cross-sections 5(a)–5(c) of the resulting structure during the implementation of the process of FIG. 5 in accordance with an embodiment of the present invention.
Figure 7:
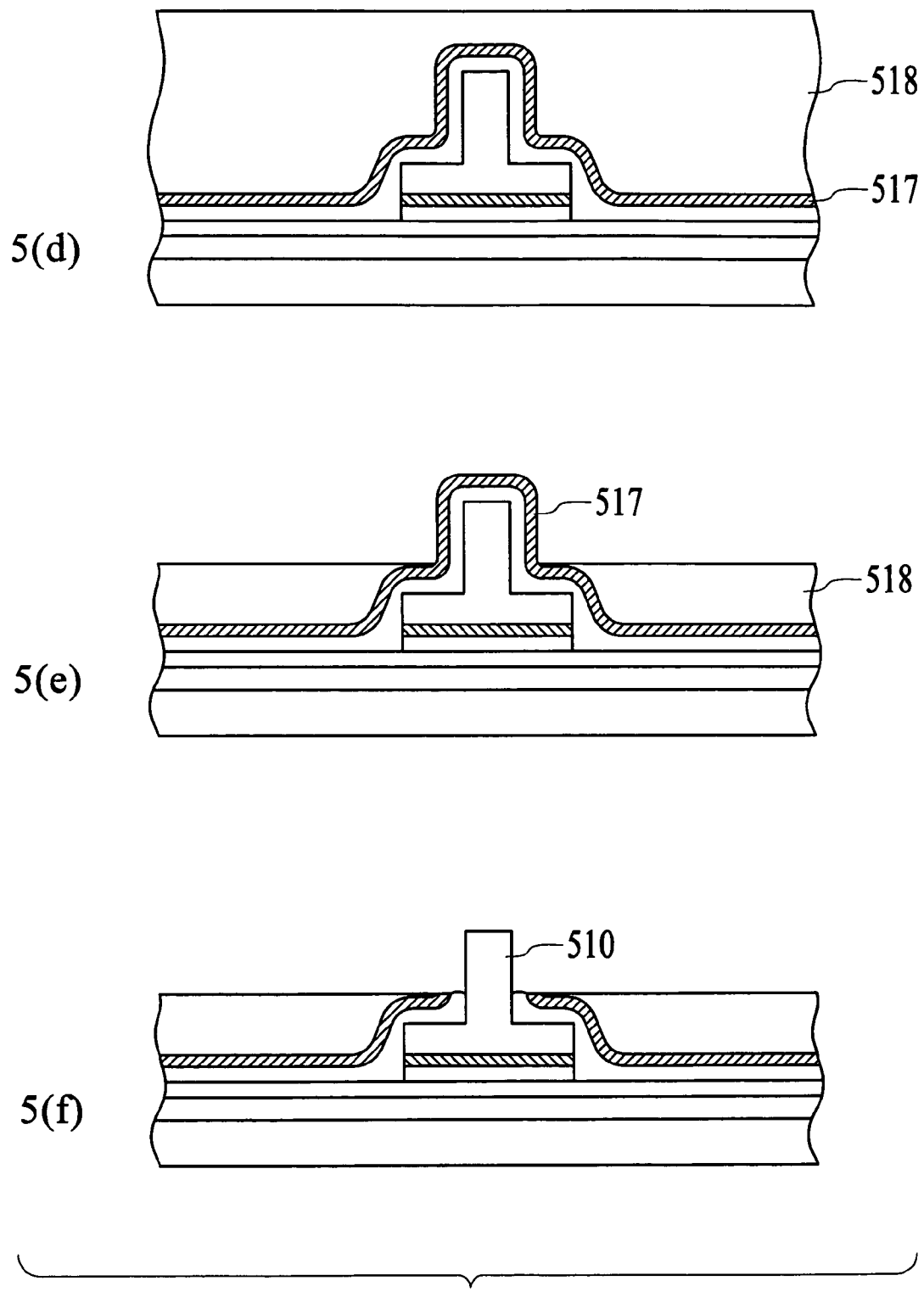
FIG. 7 shows cross-sections 5(d)–5(f) of the resulting structure during the implementation of the process of FIG. 5 in accordance with an embodiment of the present invention.
Figure 8:
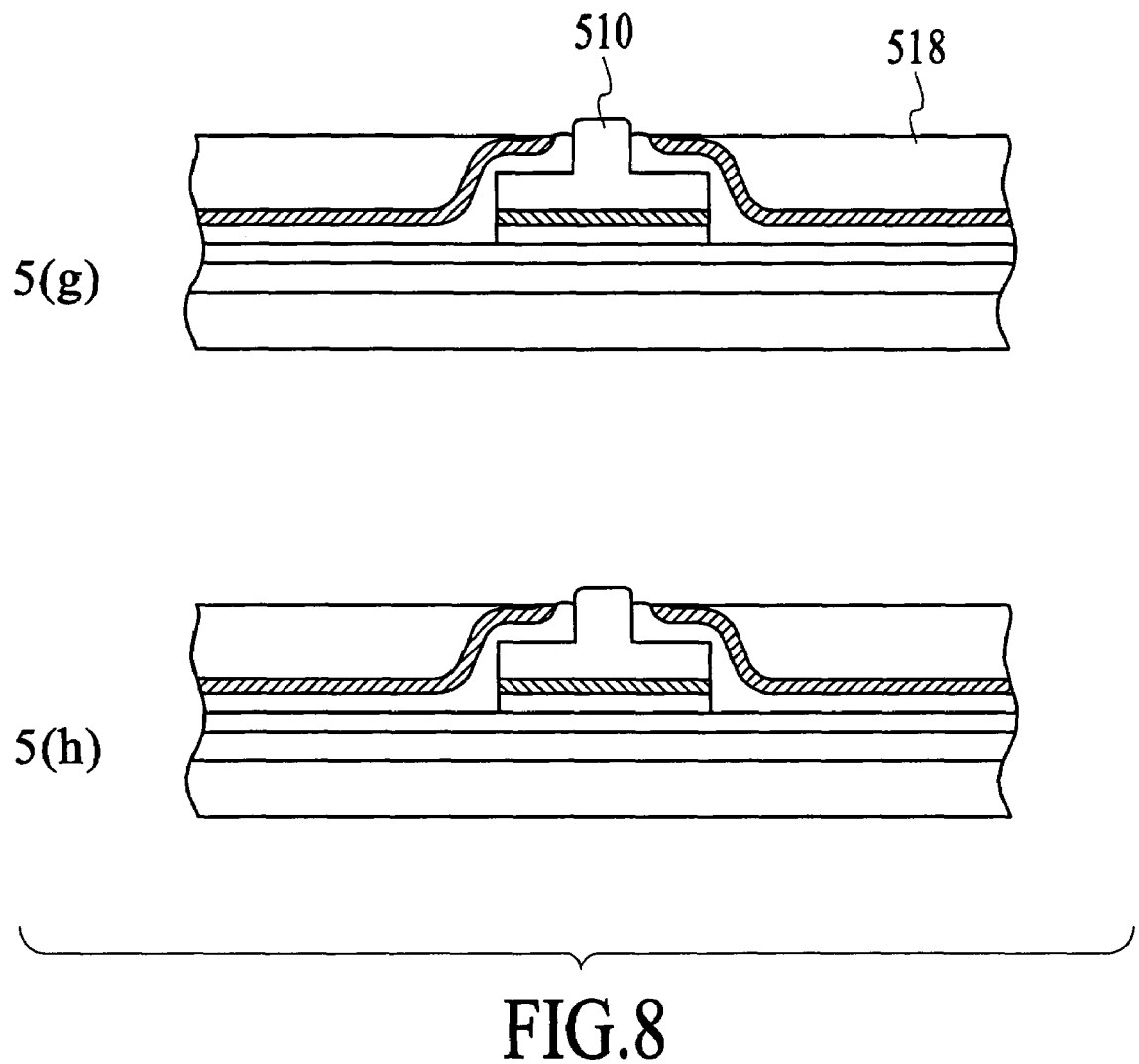
FIG. 8 shows cross-sections 5(g) and 5(h) of the resulting structure during the implementation of the process of FIG. 5 in accordance with an embodiment of the present invention.

FIG. 5 shows a process for forming a plurality of thin-film devices in accordance with one embodiment. For illustrative purposes, FIGS. 6–8 show cross-sections 5(a)–5(g) of the resulting structure during the implementation of the process of FIG. 5.

Cross-section 5(a) shows a structure that includes an imprint polymer 510, a gate metal layer 511, a dielectric layer 512, a silicon layer 513, a buffer layer 514 and a flexible substrate 515. A first step 501 involves etching portions of the metal layer and the dielectric layer. Here, the imprint polymer 510 acts as a mask. Cross-section 5(b) shows the imprint polymer 510 and the remaining portions of layers 511 and 512. In one embodiment, the portions of the metal layer 511 and the dielectric layer 512 are removed by a dry etch process such as reactive ion etching (RIE) or ion-milling.

In an RIE process, the substrate is placed inside a reactor in which several gases are introduced. A plasma is struck in the gas mixture using an RF power source, breaking the gas molecules into ions and reactive species. The ions and reactive species react with the surface of the material being etched, forming another gaseous material. This is known as the chemical part of RIE etching. There is also a physical portion that is similar in nature to a sputtering deposition process.

If the ions have high enough energy, they can knock atoms out of the material to be etched without a chemical reaction. It is a very complex task to develop dry etch processes that balance chemical and physical etching, since there are many parameters to adjust. By changing the balance it is possible to influence the anisotropy of the etching, since the chemical part is isotropic and the physical part is highly anisotropic. Accordingly, RIE is capable of performing a very directional etch.

Ion-milling is a physical dry etching technique where a sample is exposed to a collimated beam of accelerated, mono-energetic inert ions thereby removing material due to ion impingement. The ion-milling systems typically incorporate a double-gridded ion source of the Kaufman type that supply acceleration voltages ranging from ~200 V to ~1.5 kV. Argon (p~2E-4 Torr) is typically used as the working gas. The sample is mounted on a rotating water-cooled stage that can be tilted with respect to the incoming Ar-ions.

Ion-milling is used for the fabrication of sub-micron gratings as well as for structuring samples incorporating very different materials such as metal/insulator/semiconductor-combinations since the etch rates of these materials are of comparable magnitude (e.g. GaAs: 80 nm/min, Au: 75 nm/min, silicon nitride: 25 nm/min, photoresist: ~20 nm/min for 500 eV-Ar ions). Accordingly, ion-milling provides a very flexible tool for the performance of directional etching.

Although ion-milling and RIE etch process have been described in conjunction with the above-disclosed embodiment, one of ordinary skill in the art will readily recognize that a variety of different etch processes could be utilized while remaining within the spirit and scope of the present invention.

A second step 502 involves depositing a doped layer of silicon. In one embodiment the doped layer of silicon is an amorphous or microcrystalline layer of Si N+. A third step 503 involves depositing a source-drain metal layer in contact with the layer of Si N+. Cross-section 5(c) shows the structure that includes the layer of Si N+ 516 in contact with the source-drain metal layer 517. Examples of adequate source-drain metal include Al, TiW, Cr or the like.

A fourth step 504 involves applying a planarization material to the source-drain metal layer. Cross-section 5(d) shows the planarization material 518 in contact with the source-drain metal layer 517. Examples of adequate planarization materials are photo-resist, UV-curable polymers and spin-on glass.

A fifth step 505 includes removing a portion of the planarization material. Here, a portion of the source-drain metal layer 517 is exposed. Cross-section 5(e) shows the structure that includes the remaining portion of the planarization material 518 and the exposed portion of the source drain metal layer 517.

A sixth step 506 includes removing the exposed portion of the source-drain metal layer and a portion of the Si N+ layer. Here, a portion of the imprint polymer 510 is exposed. Cross-section 5(f) shows the exposed imprint polymer 510.

A seventh step 507 includes thinning the exposed portion of the imprint polymer. Cross-section 5(g) shows the structure after the exposed portion of the imprint polymer 510 has been thinned down. As can be seen, a remaining portion of the planarization material 518 is left since this etching step has the selectivity to remove the imprint polymer 510 but not the planarization material 518 or the substrate.

A final step 508 includes removing portions of the gate metal layer, the dielectric layer and the silicon layer (not shown in the figure). Subsequently, the planarization material is removed. Cross-section 5(h) shows the resulting structure.

Optionally, after step 504, a planarization step can be introduced. In an embodiment, this step is accomplished via a chemical-mechanical polishing (CMP) process. CMP removes material from the top layer of a substrate in the production of ultra-high density integrated circuits. In a typical CMP process, the top layer is exposed to an abrasive medium under controlled chemical, pressure, velocity, and temperature conditions. Abrasive media includes slurry solutions and polishing pads. The slurry solution can be provided shortly before use by mixing a so-called precursor with an oxidizing agent. The precursor lacks the oxidizing agent, but includes the other components of the slurry (e.g., abrasive media, catalysts, water).

Figure 9:
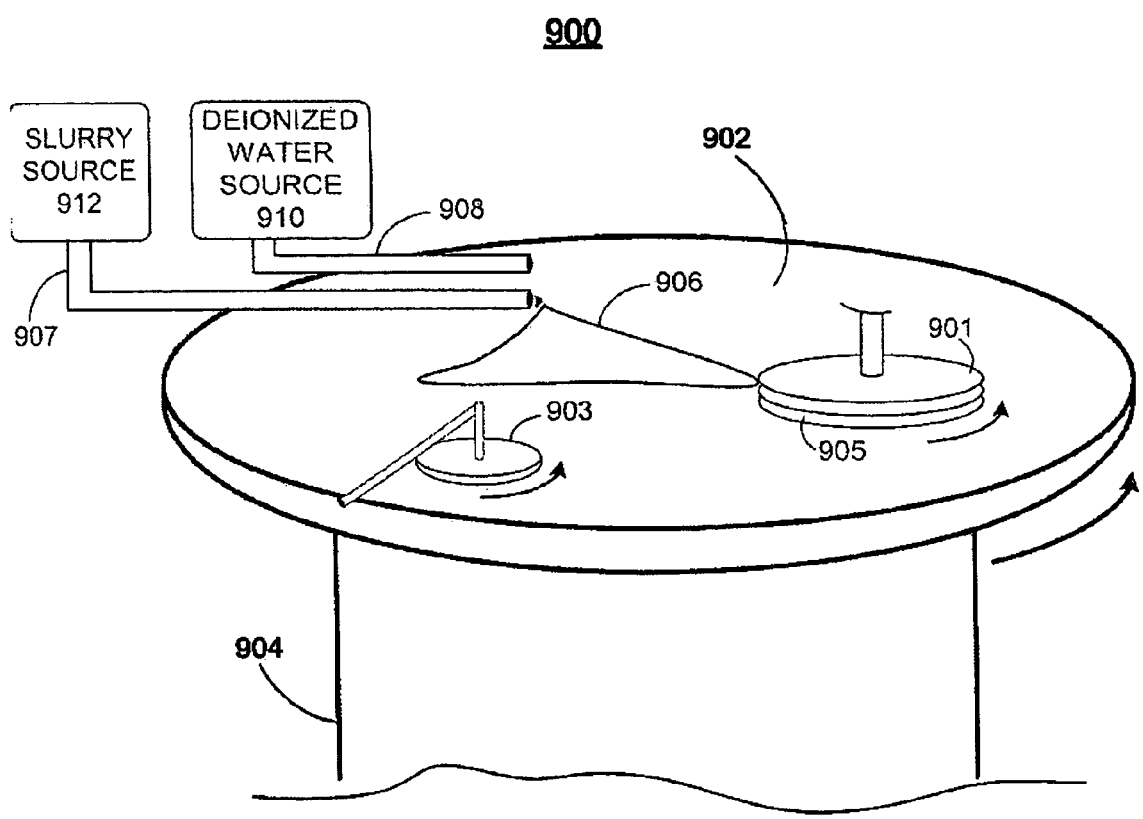
FIG. 9 shows a block diagram of a CMP machine.
Figure 10:
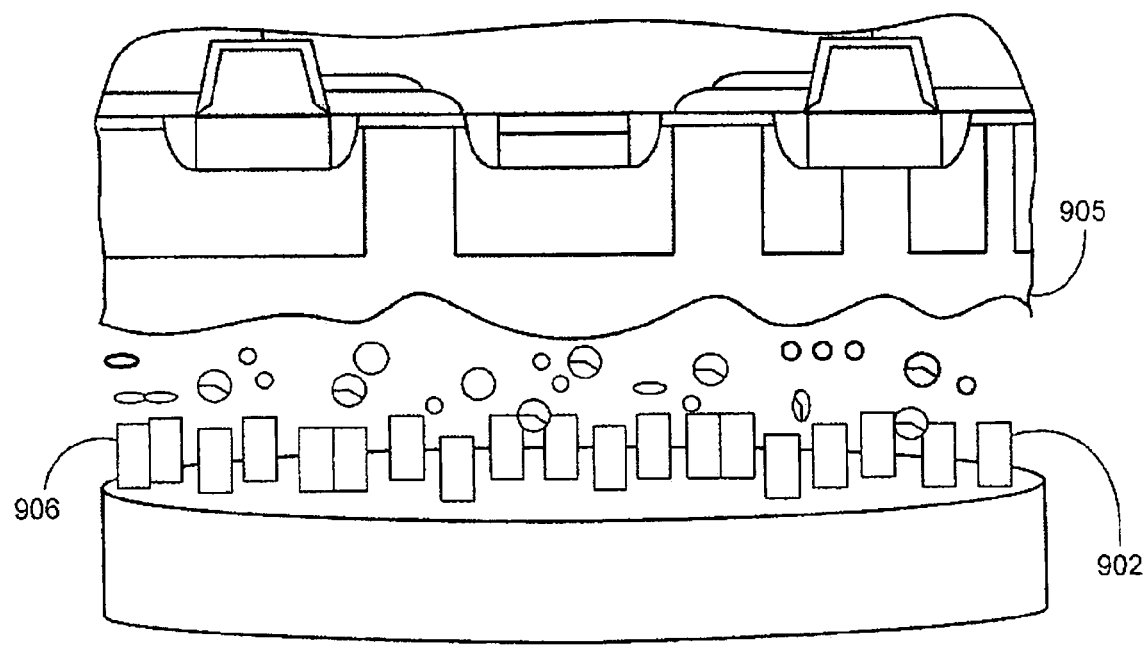
FIG. 10 is a side partial perspective view of a semiconductor wafer.

Referring now to FIGS. 9 and 10, there is shown a block diagram of a CMP machine 900 including a rotary process table and a side partial perspective view of a semiconductor wafer 905 (FIG. 10). The CMP machine 900 is fed wafers to be polished by an arm 901 and places them onto a rotating polishing pad 902. The polishing pad 902 is made of a resilient material and is textured, often with a plurality of predetermined grooves, to aid the polishing process. A conditioning arm 909 conditions the polishing pad. A wafer is held in place on the polishing pad 902 by the arm 901 with a predetermined amount of down force.

During polishing, the lower surface of the wafer 905 rests against the polishing pad 902. As the polishing pad 902 rotates, the arm 901 rotates the wafer 905 at a predetermined rate. The CMP machine 900 also includes a slurry dispense tube 907, extending across the radius of the polishing pad 902. The slurry dispense tube 907 dispenses a flow of slurry 906 onto the polishing pad 902 from the slurry source 912. Typically, the polishing pad 902 is primed with slurry 906 for about 8 seconds. The slurry 906 is a mixture of de-ionized water and polishing agents designed to aid chemically the smooth and predictable planarization of the wafer. The rotating action of both the polishing pad 902 and the wafer 905, in conjunction with the polishing action of the slurry, combine to planarize, or polish, the wafer 905 at some nominal rate. In current systems using silica slurry the pH of the slurry is very high, typically having a pH of around 10 or 11. After the slurry dispense process is terminated, de-ionized water is dispensed from the de-ionized water source 910 via the water dispense tube 908 onto the pad. The wafer substrate is then rid of the slurry.

Although the above-described embodiment discloses the employment of a CMP etch process, one of ordinary skill in the art will readily recognize that a variety of other planarization processes are capable of being implemented while remaining within the spirit and scope of the present invention.

Figure 11:
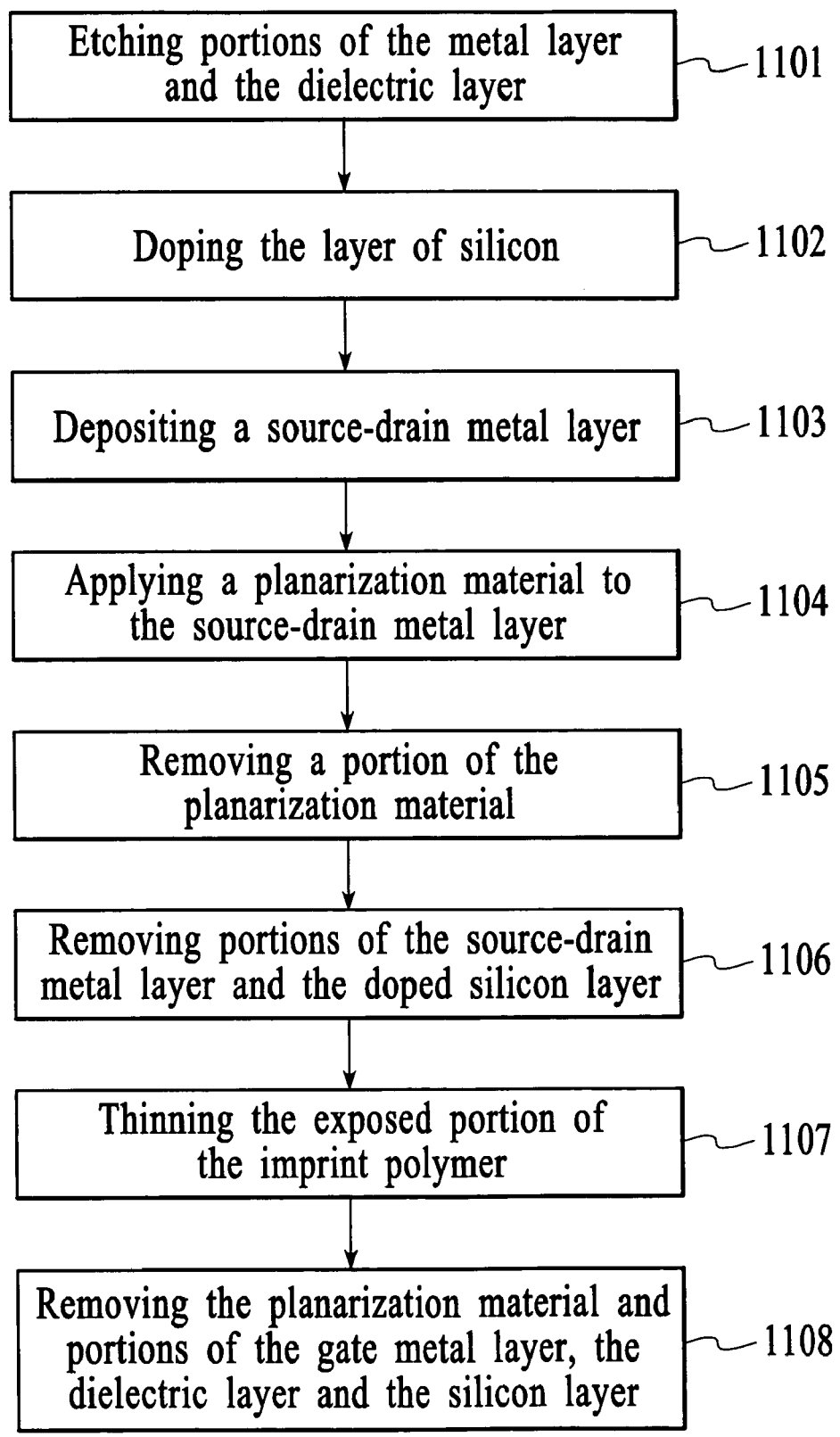
FIG. 11 shows an alternate process for forming a plurality of thin-film devices in accordance with an alternate embodiment of the present invention.
Figure 12:
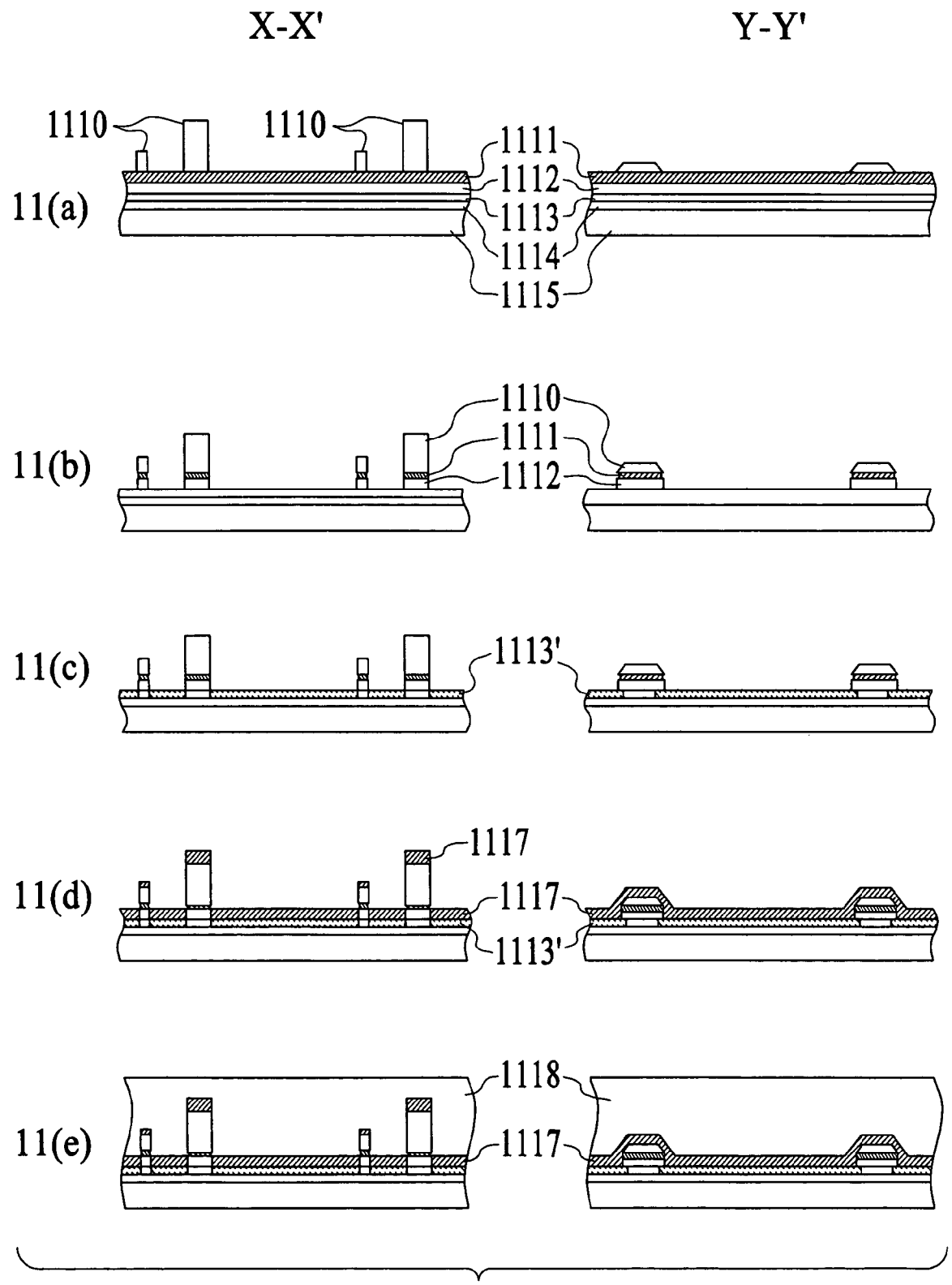
FIG. 12 shows cross-sections 11(a)–11(e) of sections X–X' and Y–Y' of the resulting structure during the implementation of the process of FIG. 11 in accordance with an alternate embodiment of the present invention.
Figure 13:
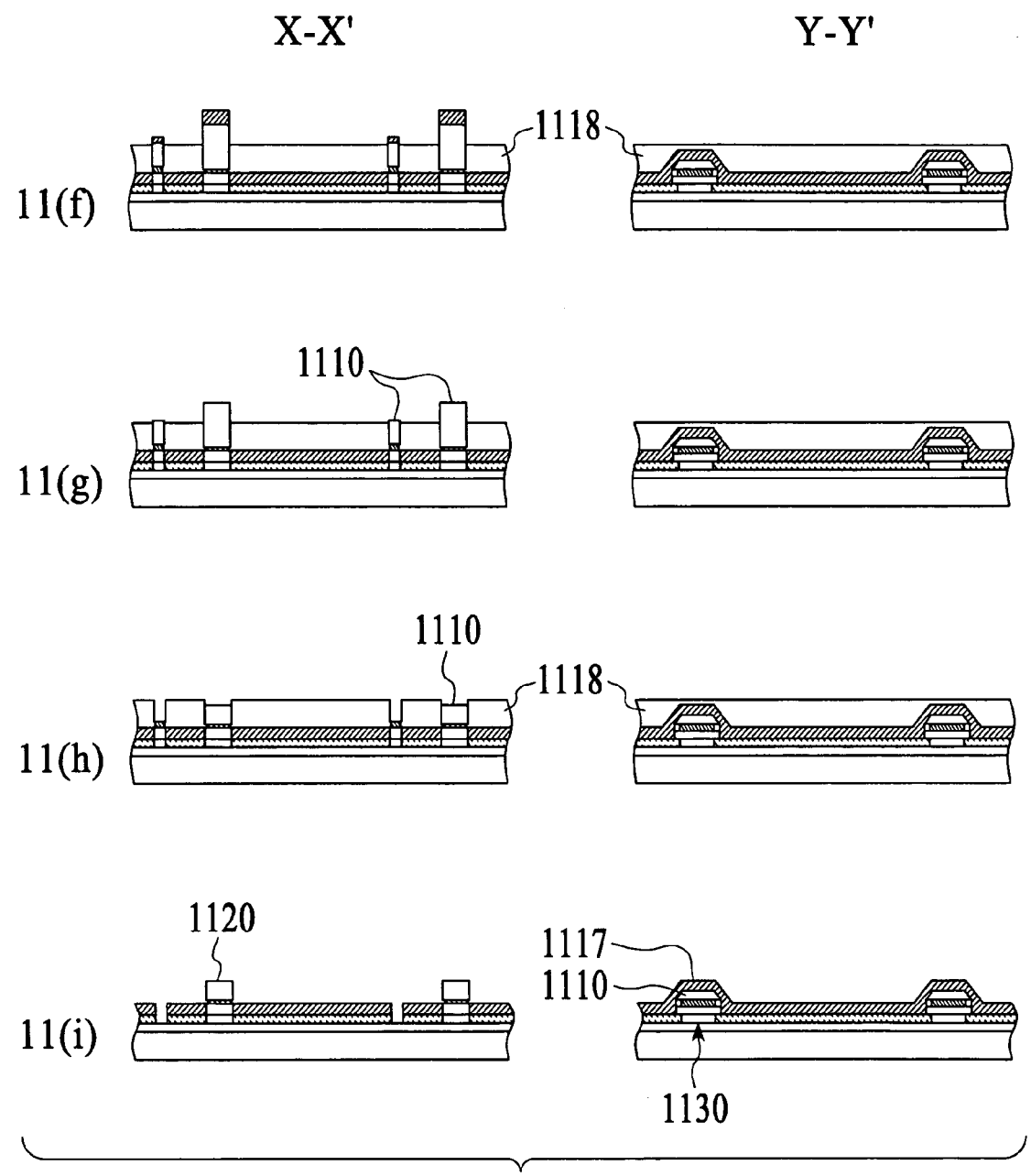
FIG. 13 shows cross-sections 11(f)–11(i) of sections X–X' and Y–Y' of the resulting structure during the implementation of the process of FIG. 11 in accordance with an alternate embodiment of the present invention.

FIG. 11 shows an alternate process for forming a plurality of thin-film devices in accordance with an alternate embodiment. In this process, a doping step is introduced. FIGS. 12–13 show cross-sections 11(a)–11(i) of sections X–X' and Y–Y' (see FIG. 4) of the resulting structure during the implementation of the process of FIG. 11.

Cross-section 11(a) shows a structure that includes an imprint polymer 1110, a gate metal layer 1111, a dielectric layer 1112, a silicon layer 1113, a buffer layer 1114 and a flexible substrate 1115. A first step 1101 involves etching portions of the gate metal layer and the dielectric layer. Here, the imprint polymer 1110 acts as a mask. Cross-section 11(b) shows the imprint polymer 1110 and the remaining portions of layers 1111 and 1112. In one embodiment, the portions of the metal layer 1111 and the dielectric layer 1112 are removed by a dry etch process.

A second step 1102 involves doping the silicon layer. Step 1102 can be performed by utilizing a laser doping technique or a plasma doping technique. Cross-section 11(c) shows the doped silicon layer 1113'.

Generally, with laser doping, the silicon surface is exposed to intense irradiation by an excimer laser for a period lasting only several nanoseconds (approximately 50 ns or less). During this period, the silicon surface transitions from solid to liquid, at which time dopants diffuse into the liquid silicon.

Specifically, laser doping uses an excimer laser, often a XeCl laser, as an energy source. In projection gas immersion laser doping (P-GILD), a reflective reticle is used. The output of the laser is directed through optics to homogenize the beam and then passed through an illuminator to scan the beam over a dielectric reticle. The reticle is then imaged, via projection optics, onto the wafer. In the illuminated areas, the incident photon energy is absorbed in approximately the top 7 nm of the silicon and converted to thermal energy, heating the surface and activating the diffusion of the impurities into the substrate.

Laser doping is advantageous for several reasons. First, dopants generally will penetrate throughout the liquid silicon, but will only minimally diffuse into the solid regions. Thus, junction depth is controlled by the melt depth of the silicon. Second, high-temperature anneal steps are not required because impurities are incorporated into electrically active sites and no damage is imparted to the substrate due to solidification of the silicon. Third, control of the process is generally simple. Fourth, the process results in low sheet and contact resistances. And finally, the process eliminates considerable photoresist processing.

In a plasma doping system, a semiconductor wafer is placed on a conductive platen which functions as a cathode. An ionizable gas containing the desired dopant material is introduced into the chamber, and a high voltage pulse is applied between the platen and an anode or the chamber walls, forming a plasma having a plasma sheath in the vicinity of the wafer. The applied voltage accelerates ions in the plasma across the plasma sheath and implants the ions into the wafer. The depth of implantation is related to the voltage applied between the wafer and the anode.

In the plasma doping system described above, the high voltage pulse generates the plasma and accelerates positive ions from the plasma toward the wafer. In other types of plasma implantation systems, known as Plasma-Source Ion Implantation, PSII, systems, a separate plasma source is used to provide a continuous plasma. (These implantation systems are also known by several other acronyms, the most common being Plasma-immersion Ion implantation, PIII.) In such systems, the platen and the wafer are immersed in this continuous plasma and at intervals, a high voltage pulse is applied between the platen and the anode, causing positive ions in the plasma to be accelerated toward the wafer.

Although the embodiment is described as being utilized in conjunction with laser doping techniques and plasma doping techniques, one of ordinary skill in the art will readily recognize that a variety of different doping techniques could be utilized while remaining within the spirit and scope of the present invention.

A third step 1103 involves depositing a source-drain metal layer in contact with the doped layer of silicon. Cross-section 11(d) shows the structure that includes the doped layer of silicon 1113' in contact with the source-drain metal layer 1117.

A fourth step 1104 involves applying a planarization material to the source-drain metal layer. Cross-section 11(e) shows the planarization material 1118 in contact with the source-drain metal layer 1117.

A fifth step 1105 includes removing a portion of the planarization material. Here, a portion of the source-drain metal layer 1117 is exposed. Cross-section 11(f) shows the structure that includes the remaining portion of the planarization material 1118 and the exposed portion of the source drain metal layer 1117.

A sixth step 1106 includes removing the exposed portion of the source-drain metal layer. Here, a portion of the imprint polymer 1110 is exposed. Cross-section 11(g) shows the exposed imprint polymer 1110.

A seventh step 1107 includes thinning the exposed portion of the imprint polymer. Cross-section 11(h) shows the structure after the exposed portion of the imprint polymer 1110 has been removed. As can be seen, a remaining portion of the planarization material 1118 is left since this etching step has the selectivity to remove the imprint polymer 1110 but not the planarization material 1118 or the substrate.

A final step 1108 includes removing portions of the gate metal layer, the dielectric layer, the silicon layer, and the planarization material Cross-section 11(i) shows the resulting structure. As can be seen, the structure includes a transistor 1120 and an interconnection 1130 to another transistor (not shown) wherein the interconnection includes the imprint polymer 1110 between the gate metal 1111 and the source drain metal 1117.

Although the above-described embodiments are disclosed in the context of being utilized to form an array of transistors, one of ordinary skill in the art will readily recognize that a variety of different devices could be fabricated while remaining within the spirit and scope of the present invention.

A method and system for forming a plurality of thin-film devices is disclosed. Varying embodiments of the method and system allow a SAIL process to be utilized to form a plurality of thin-film devices on a flexible substrate. Consequently, a roll-to-roll manufacturing process can be employed in conjunction with the SAIL process to provide a low cost manufacturing solution for large area and/or flexible displays.

Without further analysis, the foregoing so fully reveals the gist of the present invention that others can, by applying current knowledge, readily adapt it for various applications without omitting features that, from the standpoint of prior art, fairly constitute essential characteristics of the generic or specific aspects of this invention. Therefore, such applications should and are intended to be comprehended within the meaning and range of equivalents of the following claims. Although this invention has been described in terms of certain embodiments, other embodiments that are apparent to those of ordinary skill in the art are also within the scope of this invention, as defined in the claims that follow.

What is claimed is:

1. A method for forming a plurality of thin-film devices comprising:
   providing a flexible substrate; and
   utilizing a self-aligned imprint lithography (SAIL) process to form the plurality of thin-film devices on the flexible substrate wherein the SAIL process comprises:
   depositing at least one material over the flexible substrate;
   forming a 3D structure over the at least one material; and
   patterning the at least one material in accordance with the desired characteristics of the plurality of thin-film devices.

2. The method of claim 1 wherein the plurality of thin-film devices comprises an array of interconnected transistors.

3. The method of claim 2 wherein the array of interconnected transistors comprises an active matrix backplane.

4. The method of claim 1 wherein utilizing a SAIL process includes:
   depositing a planarization material.

5. The method of claim 4 wherein the planarization material is at least one of a photo-resist, a UV-curable polymers and a spin-on glass.

6. The method of claim 1 wherein the 3D structure is comprised of an imprint polymer.

7. The method of claim 1 wherein forming a 3D structure over the at least one material comprises:
depositing an imprint polymer over the at least one material; and
forming a 3D pattern in the imprint polymer.

8. The method of claim 1 wherein depositing at least one material over the flexible substrate further comprises:
depositing a buffer layer of material on the flexible substrate;
depositing a layer of Si over the buffer layer;
depositing a dielectric layer over the Si layer; and
depositing a gate metal layer over the dielectric layer.

9. The method of claim 8 wherein patterning the at least one material comprises:
etching the gate metal layer and the dielectric layer thereby exposing the Si layer;
providing a doped Si layer;
depositing a metal layer;
depositing a planarization material;
removing a portion of the planarization material thereby exposing a portion of the metal layer;
removing the exposed portion of the metal layer thereby exposing a portion of the imprint polymer;
removing a portion of the imprint polymer; and
etching the gate metal layer, the dielectric layer and the Si layer.

10. The method of claim 9 further comprising:
removing the planarization material.

11. The method of claim 9 wherein the planarization material is capable of being selectivity removed with respect to the imprint polymer.

12. The method of claim 9 wherein providing a doped Si layer further comprises:
utilizing a laser doping process to dope the Si layer.

13. The method of claim 9 wherein providing a doped Si layer further comprises:
utilizing a plasma doping process to dope the Si layer.

14. The method of claim 9 wherein providing a doped Si layer further comprises:
depositing a doped layer of Si.

15. The method of claim 9 wherein the step of depositing a planarization material further comprises:
planarizing the planarization material via a chemical-mechanical polishing process.

16. A system for forming a plurality of thin-film devices comprising:
means for utilizing a SAIL process in conjunction with a flexible substrate to form a plurality of thin-film devices on the flexible substrate wherein the means for utilizing a SAIL process comprises:
means for depositing at least one material over the flexible substrate;
means for forming a 3D structure over the at least one material; and
means for patterning the at least one material in accordance with the desired characteristics of the plurality of thin-film devices.

17. The system of claim 16 wherein the plurality of thin-film devices comprises an array of interconnected transistors.

18. The system of claim 17 wherein the array of interconnected transistors comprises an active matrix backplane.

19. The system of claim 16 wherein the means for utilizing a SAIL process includes:
means for depositing a planarization material.

20. The system of claim 19 wherein the planarization material is at least one of a photo-resist, a UV-curable polymers and a spin-on glass.

21. The system of claim 16 wherein the 3D structure is comprised of an imprint polymer.

22. The system of claim 16 wherein the means for forming a 3D structure over the at least one material comprises:
means for depositing an imprint polymer over the at least one material; and
means for forming a 3D pattern in the imprint polymer.

23. The system of claim 16 wherein the means for depositing at least one material over the flexible substrate further comprises:
means for depositing a buffer layer of material on the flexible substrate;
means for depositing a layer of Si over the buffer layer;
means for depositing a dielectric layer over the Si layer; and
means for depositing a gate metal layer over the dielectric layer.

24. The system of claim 23 wherein the means for patterning the at least one material comprises:
means for etching the gate metal layer and the dielectric layer thereby exposing the Si layer;
means for providing a doped Si layer;
means for depositing a metal layer;
means for depositing a planarization material;
means for removing a portion of the planarization material thereby exposing a portion of the metal layer;
means for removing the exposed portion of the metal layer thereby exposing a portion of the imprint polymer;
means for removing a portion of the imprint polymer; and
means for etching the gate metal layer, the dielectric layer and the Si layer.

25. The system of claim 24 further comprising:
means for removing the planarization material.

26. The system of claim 24 wherein the planarization material is capable of being selectivity removed with respect to the imprint polymer.

27. The system of claim 24 wherein the means for providing a doped Si layer further comprises a laser doping process to dope the Si layer.

28. The system of claim 24 wherein the means for providing a doped Si layer further comprises a plasma doping process to dope the Si layer.

29. The system of claim 24 wherein the means for providing a doped Si layer further comprises:
means for depositing a doped layer of Si.

30. A method for forming a plurality of thin-film devices comprising:
- providing a non-flexible substrate; and
- utilizing a self-aligned imprint lithography (SAIL) process to form the plurality of thin-film devices on the non-flexible substrate wherein the SAIL process comprises:
  - depositing at least one material over the flexible substrate;
  - forming a 3D structure over the at least one material; and
  - patterning the at least one material in accordance with the desired characteristics of the plurality of thin-film devices.

* * * * *